United States Patent [19]

Fushiki et al.

[11] Patent Number: 4,486,505
[45] Date of Patent: Dec. 4, 1984

[54] FLAME-RETARDED COPPER CLAD LAMINATES

[75] Inventors: Yasuo Fushiki, Takatsuki; Masayuki Oizumi, Otsu; Masaharu Abe, Kobe; Makoto Watanabe, Shiga, all of Japan

[73] Assignee: Kanegafuchi Kagaku Kogyo Kabushiki Kaisha, Osaka, Japan

[21] Appl. No.: 441,634

[22] Filed: Nov. 15, 1982

[30] Foreign Application Priority Data

Nov. 16, 1981 [JP] Japan ................................ 56-184300

[51] Int. Cl.$^3$ ...................... B32B 15/08; B32B 15/12; B32B 27/04; B32B 27/42
[52] U.S. Cl. .................................... 428/416; 428/464; 428/460; 428/920; 428/921; 428/458
[58] Field of Search ............... 428/460, 920, 921, 416, 428/464, 458

[56] References Cited

U.S. PATENT DOCUMENTS

| | | | |
|---|---|---|---|
| 2,920,990 | 1/1960 | Been et al. | 428/460 X |
| 3,202,567 | 8/1965 | Muri et al. | 428/921 X |
| 3,526,573 | 9/1970 | Kepple et al. | 428/460 X |
| 3,666,617 | 5/1972 | Marciniak | 428/460 X |
| 4,298,720 | 11/1981 | Yamazaki et al. | 526/262 |
| 4,370,386 | 1/1983 | Vekita et al. | 428/460 X |

Primary Examiner—George F. Lesmes
Assistant Examiner—Nancy A. B. Swisher
Attorney, Agent, or Firm—Haight & Associates

[57] ABSTRACT

A flame retarded copper clad laminate is provided comprising a plurality of paper substrate layers each impregnated with a halogen-containing unsaturated polyester resin containing about 1% to about 30% by weight of a basic filler, and a copper cladding adhesively bonded onto at least one side of the laminate.

4 Claims, No Drawings

FLAME-RETARDED COPPER CLAD LAMINATES

BACKGROUND OF THE INVENTION

This invention relates to a flame retarded copper clad laminate made of a plurality of paper substrates impregnated with a halogen-containing unsaturated polyester resin.

Copper clad laminates used for the production of printed circuit wiring boards require excellence not only in mechanical and electrical properties but also in flame retardance, heat resistance, tracking resistance and other safety properties. Flame retardance may be imparted by incorporating a halogen-containing flame retardant into the resin composition used for the impregnation of substrates. The use of a large amount of such halogen-containing flame retardant, however, often causes the resulting laminate to be deteriorated in mechanical and electrical properties, heat resistance and tracking resistance.

It is known to produce a flame retarded unsaturated polyester composition by adding thereto a halogen-containing flame retardant or by incorporating a halogen-containing compound into the polyester chain as a reactive component. Among various halogen-containing flame retardants, aliphatic and alicyclic flame retardants are preferable because they are sufficiently effective in small amounts and thus less deleterious to the tracking resistance. However, these aliphatic and alicyclic flame retardants are susceptible to thermal decomposition so that the heat resistance of the resulting laminate is not satisfactory.

DESCRIPTION OF THE INVENTION

According to the present invention, we have found that the heat resistance of a flame retarded copper clad laminate made of a halogen-containing unsaturated polyester resin and a paper substrate may be greatly improved by incorporating a certain amount of a basic filler to the resin. The resulting laminate satisfies with both flame retardance and heat resistance requirements which have hitherto been considered incompatible while retaining excellent mechanical and electrical properties required for the production of printed circuit wiring boards. By the addition of such basic fillers, the thermal decomposition of halogen-containing unsaturated polyester resins may be greatly suppressed during the processing and use of the copper clad laminates made therefrom. For example, it is possible to produce a copper clad laminate which exhibits a high retention rate in dielectric breakdown strength and flexural strength upon a long term heat resistance test according to the UL 746 B method and also in copper foil peel strength after exposing to heat for a long period of time according to the UL-796 method.

According to the present invention, there is provided a flame retarded copper clad laminate comprising a plurality of paper substrate layers each impregnated with a halogen-containing unsaturated polyester resin containing about 1% to about 30% by weight of a basic filler, and a copper cladding adhesively bonded onto at least one side of the laminate.

The term "halogen-containing unsaturated polyester resin" as used herein stands for a unsaturated polyester resin containing a halogenated flame retardant which may be either the non-reactive or reactive type. Examples of the former fire retardants include aliphatic or alicyclic halogen compounds such as chlorinated paraffin, tetrabromethane, tetrabromocyclododecane and the like, and aromatic halogen compounds such as chlorinated diphenyl, chlorinated diphenyl ether, brominated diphenyl, brominated diphenyl ether, brominated phenols, hexabromobenzene, pentabromotoluene, tetrabromobisphenol A and the like. Examples of the latter type of flame retardants which may be incorporated into the backbone structure of the unsaturated polyester resins include polyols such as dibromoneopentyl glycol, tetrabromobisphenol A/ethylene oxide adduct and the like, polycarboxylic acids such as chlorendic acid, tetrachlorophthalic anhydride, tetrabromophthalic anhydride and the like, and cross-linking monomers such as chlorostyrene, bromostyrene, tribromophenyl acrylate or methacrylate and the like. The production of flame retarded unsaturated polyester compositions containing these flame retarding agents is well-known in the art and any known method may be employed for the production of such flame retarded unsaturated polyester resin compositions. Additionally, post-halogenated unsaturated polyester resin compositions such as those obtained by post-brominating a bromine-free unsaturated polyester including tetrahydrophthalate moieties may also be used.

The flame retardance of halogen-containing unsaturated polyester resins is generally proportional to their halogen contents. Bromine is more effective than chlorine when compared at the same halogen content level. Also the effectiveness of a halogenated flame retardant increases in the order of aromatic, alicyclic and aliphatic compounds. However, thermal stability decreases in the reverse order and bromine compounds are less stable than chlorine compounds. It is for this reason that aromatic flame retardants have been mostly used in the fields where high thermal resistance characteristics are required for the laminates. The present invention enables the use of aliphatic and alicyclic flame retardants in such fields and therefore the application thereof to unsaturated polyester resins containing an aliphatic and/or alicyclic halogen-containing, particularly bromine-containing, compound constitutes a preferred embodiment thereof.

The unsaturated polyester resin composition may also contain phosphate flame retardants such as tricresyl phosphate, cresyl diphenyl phosphate, triphenyl phosphate, diphenyl octyl phosphate, tributyl phosphate, triethyl phosphate, tris-($\beta$-chlorethyl) phosphate, tris-(dibromomethyl) phosphate, tris-(bromochloropropyl) phosphate and the like. Antimony trioxide may also be used to advantage to decrease the halogen content of the resin composition.

The resin composition may contain a curing catalyst and other additives such as fillers, colorants and the like. Epoxy compounds may be added to advantage for further improving the heat resistance.

The halogen-containing unsaturated polyester resin composition may be cured by heat in the presence of a conventional organic peroxide catalyst but it is possible to cure the resin by applying an ionizing ray such as UV light, electron beam and gamma ray.

Examples of fillers which may be used in the present invention include alkaline earth metal oxides such as magnesium oxide and calcium oxide, alkaline earth metal hydroxides such as magnesium hydroxide and calcium hydroxide, alkaline earth metal carbonates such as calcium carbonate and magnesium carbonate, basic aluminum or magnesium compounds such as alumina, alminum hydroxide, aluminum silicate, magnesium silicate and hydrotalcite, basic lead compounds such as tribasic lead sulfate, basic lead sulfite, dibasic lead phosphite, dibasic lead phthalate, tribasic lead maleate, basic lead silicate and the like. Melamine and guanamines may also be used.

The proportion of the basic filler is from about 1% to about 30%, preferably from about 2% to about 20%, more preferably from about 4% to about 12% by weight of the entire resin composition. A proportion of the basic filler less than 1% is not effective to improve the heat resistance of the resulting laminate, whereas a proportion greater than 30% adversely affects mechanical properties.

Among the above-named basic fillers, aluminum hydroxide and aluminum oxide are particularly preferable to obtain a balanced effect on heat resistance, and mechanical and electrical characteristics.

The term "paper substrate" as used herein refers to papers essentially made of cellulosic fibers such as kraft papers and cotton linter papers having a basis weight from 100 to 200 g/m$^2$ and a density of 0.3 to 0.7 g/cm$^3$. Copper clad laminates for use in printed circuit wiring boards require a good moisture resistance. For this reason, it is preferable for the paper substrate to pretreat with an N-methylol compound such as melamine resins, guanamine resins and N-methylolacrylamide prior to the impregnation with a halogen-containing unsaturated polyester resin.

Any conventional adhesive may be used for bonding the cladding copper foil to the laminate of the invention. Examples thereof include epoxy resin adhesives, polyvinylbutyral/phenol resin adhesives, and nitrile rubber/phenol resin adhesives. Epoxy resin adhesives are preferable.

According to another aspect of the present invention, said adhesive composition also contains a filler at a proportion from several % to about 40% by weight of the adhesive composition. Examples of fillers which may be used for this purpose include silica and silicates such as silica, mica, talc, asbestos, kaolinite, calcined kaolinite, montmorillonite and pyrophyllite, metal oxides such as magnesium oxide, alumina, calcium oxide, lead oxide and zinc oxide; carbonates such as magnesium carbonate and calcium carbonate; hydroxides such as calcium hydroxide, magnesium hydroxide and aluminum hydroxide; basic lead salts such as tribasic lead sulfate and basic lead sulfite; and organic fillers such as melamine and guanamines. These fillers may prevent or suppress the decrease in peel strength of copper foil upon heating the clad laminate at an elevated temperature. It is postulated that these fillers exhibit a shielding effect against hydrogen halides such as HCl or HBr generated by the thermal decomposition of halogen-containing unsaturated polyester resins which will otherwise attack the adhesive layer and decrease the peel strength of the cladding. When the filler is a basic compound such as magnesium oxide, magnesium hydroxide, aluminum hydroxide, alumina, basic lead salts or melamine, the effect on the retention of peel strength is more remarkable. This may be attributed to their capability of binding hydrogen halides. The thickness of the adhesive layer ranges from 5 to 150 μm, preferably from 20 to 80 μm.

The copper clad laminate of the present invention may be produced in a conventional manner by impregnating a plurality of paper substrates with an resin composition of the type hereinbefore described, laminating the plurality of resin-impregnated substrates together and a copper foil on one or both sides, and curing the laminate. One continuous method which is suitable for producing the copper clad laminate of the present invention is disclosed in Japanese Laid Open Patent Application No. 98,136/1981.

The basic fillers used in the present invention may be incorporated into the halogen-containing unsaturated polyester resin composition in any conventional process such as mixing or roll milling. It is important for the fillers to be uniformly dispersed in the resin composition in order to exhibit their effect to the fullest extent. The filler particles may be coated with a silane coupling agent or organic titanate coupling agent to facilitate their uniform dispersion. The particle size of fillers is preferably as fine as possible, for example from 0.1 to 7 μm size because finer particles exhibit easier penetration into the paper substrate and a larger specific surface area.

The following examples are given by way of illustration and not by way of limitation. All parts and percents therein are by weight.

EXAMPLE 1

An unsaturated polyester was produced according to the conventional process starting from dibromoneopentyl glycol, diethylene glycol, maleic anhydride and isophthalic acid at a molar ratio of 2:2:1:3. Styrene monomer was added thereto to a styrene content of 32% to obtain a halogen-containing unsaturated polyester resin having a bromine content of 16%.

100 parts of the resin were uniformly mixed with 6 parts of tribasic lead sulfate and 2 parts of antimony trioxide on a roll mill. To the mixture were added one part of cumene hydroperoxide and 0.2 parts of 6% cobalt naphthenate to give a halogen-containing unsaturated polyester resin composition.

A kraft paper having a basis weight of 150 g/m$^2$ and a thickness of 290 μm was impregnated with the above resin composition. A total of five sheets of thusly impregnated paper were superimposed. An electrolytic copper foil 35 μm thick coated on one side with a mixture of 70 parts of EPIKOTE 828 (Shell Chemical Co.) and 30 parts of VERSAMID 125 (Henkel Japan Limited) and a cellophane film 35 μm thick were further laminated with the above assembly on the respective sides. The entire laminate was continuously conveyed through a tunnel oven, cured at 110° C. for 30 minutes and cut into a suitable size. The product was further heated at 100° C. for 10 hours and then at 160° C. for 10 minutes to complete the curing reaction. A copper clad laminate having a thickness of 1.6 mm was obtained. The performance of this laminate is shown below in the Table.

EXAMPLE 2

Example 1 was repeated except that 6 parts of aluminum hydroxide (HIJILITE H42M, Showa Keikinzoku Co., Ltd.) replaced 6 parts of tribasic lead sulfate. The performance of the resulting 1.6 mm thick copper clad laminate is shown in the Table.

EXAMPLE 3

Example 2 was repeated except that the epoxy adhesive layer applied on one side of the copper foil comprised 70 parts of EPIKOTE 828, 30 parts of VERSAMID and 15 parts of magnesium oxide. The performance of the resulting 1.6 mm thick copper clad laminate is shown in the Table.

COMPARATIVE EXAMPLE

Example 1 was repeated except that the resin composition did not contain tribasic lead sulfate at all. The performance of the resulting 1.6 mm thick copper clad laminate is shown in the Table.

TABLE

| Test item | Example 1 | Example 2 | Example 3 | Comparative Example | Test Method |
| --- | --- | --- | --- | --- | --- |
| Copper foil peel strength, after heating at 150° C. × 10 days, kg/cm | 0.75–0.88 | 0.67–0.73 | 1.09–1.35 | 0.21–0.30 | UL 796 |
| Retention rate, flexural strength, after heating at 160° C. × 10 days, % | 73% (longitudinal) 71% (lateral) | 69% 72% | 71% 70% | 54% 56% | UL 746 A |
| Retention rate, dielectric breakdown strength, after heating at 160° C. × 10 days, % | 113% | 109% | 110% | 98% | UL 746 A |
| Color change, after heating at 150° C. × 10 days | Slight, Foxy | Slight, Foxy | Slight, Foxy | Heavy, Black | Visual |

The above has been offered for illustrative purposes only, and it is not for the purposes of limiting the scope of this invention which is defined in the claims below.

We claim:

1. In a flame retarded copper clad laminate comprising a plurality of paper substrate layers each impregnated with a halogen-containing unsaturated polyester resin composition and a copper cladding adhesively bonded onto at least one side of said laminate, the improvement wherein said halogen-containing unsaturated polyester resin composition contains a basic filler consisting essentially of aluminum hydroxide in a proportion from about 1% to about 30% by weight of said resin composition.

2. The flame retarded copper clad laminate of claim 1, wherein said halogen-containing resin composition contains an aliphatic halogenated flame retarding agent and/or an alicyclic halogenated flame retarding agent.

3. The flame retarded copper clad laminate of claim 1, wherein said copper foil is bonded with an epoxy adhesive composition containing a basic filler consisting essentially of aluminum hydroxide at a proportion from several % to about 40% by weight of said adhesive composition.

4. The flame retarded copper clad laminate of claim 3, wherein said halogen-containing resin composition contains an aliphatic halogenated flame retarding agent and/or an alicyclic halogenated flame retarding agent.

* * * * *